United States Patent
Rose et al.

(10) Patent No.: US 9,691,924 B1
(45) Date of Patent: Jun. 27, 2017

(54) SOLAR CELL INTERCONNECT WITH MULTIPLE CURRENT PATHS

(75) Inventors: Douglas H. Rose, San Jose, CA (US); Shandor G. Daroczi, Santa Clara, CA (US); Neil Kaminar, Santa Cruz, CA (US)

(73) Assignee: SunPower Corporation, San Jose, CA (US)

( * ) Notice: Subject to any disclaimer, the term of this patent is extended or adjusted under 35 U.S.C. 154(b) by 929 days.

(21) Appl. No.: 13/414,165

(22) Filed: Mar. 7, 2012

Related U.S. Application Data

(63) Continuation of application No. 11/895,640, filed on Aug. 23, 2007, now Pat. No. 8,148,627.

(60) Provisional application No. 60/840,166, filed on Aug. 25, 2006.

(51) Int. Cl.
*H01R 11/11* (2006.01)
*H01L 31/05* (2014.01)

(52) U.S. Cl.
CPC ...... *H01L 31/0516* (2013.01); *H01L 31/0508* (2013.01); *Y02E 10/50* (2013.01)

(58) Field of Classification Search
USPC .......................................................... 136/244
See application file for complete search history.

(56) References Cited

U.S. PATENT DOCUMENTS

| | | | |
|---|---|---|---|
| 4,321,418 A | 3/1982 | Dran et al. | |
| 4,350,836 A * | 9/1982 | Crouthamel et al. | 136/244 |
| 4,927,770 A | 5/1990 | Swanson | |
| 5,011,544 A | 4/1991 | Gaddy et al. | |
| 5,053,083 A | 10/1991 | Sinton | |
| 5,100,808 A * | 3/1992 | Glenn | 438/68 |
| 5,164,019 A | 11/1992 | Sinton | |
| 5,185,042 A | 2/1993 | Ferguson | |
| 5,360,990 A | 11/1994 | Swanson | |
| 5,369,291 A | 11/1994 | Swanson | |
| 5,468,652 A | 11/1995 | Gee | |
| 5,660,646 A | 8/1997 | Kataoka et al. | |
| 5,972,732 A | 10/1999 | Gee et al. | |
| 6,274,402 B1 | 8/2001 | Verlinden et al. | |
| 6,313,395 B1 * | 11/2001 | Crane et al. | 136/244 |
| 6,315,575 B1 | 11/2001 | Kajimoto | |
| 6,333,457 B1 | 12/2001 | Mulligan et al. | |
| 6,337,283 B1 | 1/2002 | Verlinden et al. | |
| 6,387,726 B1 | 5/2002 | Verlinden et al. | |
| 6,423,568 B1 | 7/2002 | Verlinden et al. | |
| 6,734,656 B2 | 5/2004 | Miller et al. | |
| 7,148,774 B1 | 12/2006 | Shea et al. | |
| 7,154,361 B2 | 12/2006 | Babu et al. | |
| 7,161,105 B2 | 1/2007 | Sabisch | |
| 7,514,900 B2 | 4/2009 | Sander et al. | |
| 8,148,627 B2 | 4/2012 | Rose et al. | |

(Continued)

FOREIGN PATENT DOCUMENTS

| | | |
|---|---|---|
| JP | 2000112545 | 4/2000 |
| WO | 2006005125 | 1/2006 |

*Primary Examiner* — Shannon Gardner
(74) *Attorney, Agent, or Firm* — Okamoto & Benedicto LLP

(57) ABSTRACT

Solar cell interconnects with multiple current paths. A solar cell interconnect may include a plurality of in-plane slits arranged in several rows. The in-plane slits may be spaced to provide strain relief without unduly increasing the electrical path resistance through the solar cell interconnect. The in-plane slits may be staggered, for example.

19 Claims, 10 Drawing Sheets

(56) References Cited

U.S. PATENT DOCUMENTS

| | | |
|---|---|---|
| 8,158,877 B2 | 4/2012 | Klein et al. |
| 2002/0059952 A1 | 5/2002 | Shimada |
| 2003/0029036 A1 | 2/2003 | Gerson |
| 2003/0034062 A1* | 2/2003 | Stern et al. .................. 136/244 |
| 2004/0040593 A1 | 3/2004 | Ho et al. |
| 2004/0211459 A1 | 10/2004 | Suenaga et al. |
| 2005/0105224 A1 | 5/2005 | Nishi |
| 2005/0252546 A1 | 11/2005 | Sasaki |
| 2005/0268959 A1* | 12/2005 | Aschenbrenner et al. .................. H01L 31/0516 136/244 |
| 2006/0085167 A1 | 4/2006 | Warfield et al. |
| 2006/0170400 A1 | 8/2006 | Pai |
| 2007/0228838 A1 | 10/2007 | Delmerico et al. |

\* cited by examiner

SOLAR CELL INTERCONNECT WITH MULTIPLE CURRENT PATHS

REFERENCE TO RELATED APPLICATIONS

This application is a continuation of U.S. application Ser. No. 11/895,640, filed on Aug. 23, 2007, which claims the benefit of U.S. Provisional Application No. 60/840,166, filed on Aug. 25, 2006, both of which are incorporated herein by reference in their entirety.

BACKGROUND OF THE INVENTION

1. Field of the Invention

The present invention relates generally to solar cells, and more particularly but not exclusively to methods and structures for interconnecting solar cells in a solar cell array.

2. Description of the Background Art

Solar cells are well known devices for converting solar radiation to electrical energy. They may be fabricated on a semiconductor wafer using semiconductor processing technology. Generally speaking, a solar cell may be fabricated by forming P-type and N-type diffusion regions in a silicon substrate. Solar radiation impinging on the solar cell creates electrons and holes that migrate to the diffusion regions, thereby creating voltage differentials between the diffusion regions. In a back side contact solar cell, both the diffusion regions and the metal grids coupled to them are on the back side of the solar cell. The metal grids allow an external electrical circuit to be coupled to and be powered by the solar cell. Back side contact solar cells are also disclosed in U.S. Pat. Nos. 5,053,083 and 4,927,770, which are both incorporated herein by reference in their entirety.

Several solar cells may be electrically connected together to form a solar cell array. In a solar cell array, a conductive area coupled to a P-type diffusion region (hereinafter "positive pad") of one solar cell is electrically connected to a conductive area coupled to an N-type diffusion region (hereinafter "negative pad") of an adjacent solar cell. The positive pad of the adjacent solar cell is then electrically connected to a negative pad of a next, adjacent solar cell and so on. This chaining of solar cells may be repeated to connect several solar cells in series to increase the output voltage of the solar cell array. Back side contact solar cells have been connected together using a relatively long, single strip of perforated conductive material. U.S. Pat. No. 6,313,395, which is incorporated herein by reference in its entirety, also discloses the interconnection of several back side contact solar cells to form a solar cell array.

SUMMARY

In one embodiment, a solar cell interconnect includes a plurality of in-plane slits arranged in several rows. The in-plane slits may be spaced to provide strain relief without unduly increasing the electrical path resistance through the solar cell interconnect. The in-plane slits may be staggered, for example.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The present invention relates to interconnects for electrically connecting solar cells. Embodiments of the present invention are especially beneficial for interconnecting back side contact solar cells, such as those disclosed in the following commonly-owned disclosures: U.S. patent application Ser. No. 10/633,188, filed on Aug. 1, 2003, entitled "Solar Cell Interconnect Structure" and U.S. patent application Ser. No. 11/140,460, filed on May 27, 2005, entitled "Interconnection of Solar Cells in a Solar Cell Module." The just mentioned disclosures are included in the aforementioned U.S. Provisional Application No. 60/840,166.

Figure 1:
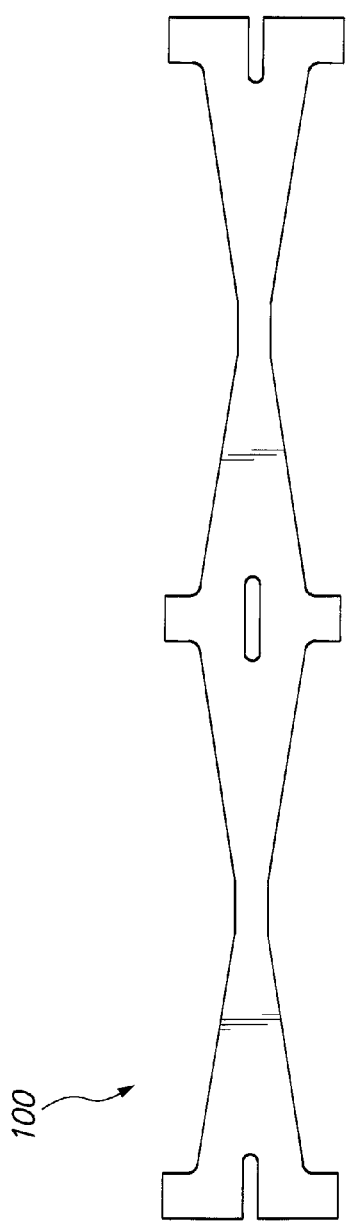
FIG. 1 shows an example continuous solar cell interconnect with a single in-plane slit in a middle portion for stress relief.

In U.S. patent application Ser. No. 10/633,188 (188 application), separate interconnect leads are employed to electrically connect adjacent back side contact solar cells (e.g., see '188 application, interconnect lead 202A shown in FIGS. 6A and 6B). While this approach is more than adequate to electrically connect back side contact solar cells, there are applications where a single continuous interconnect may be more appropriate for its added structural integrity, ease of manufacturability, and redundant electrical connections between conductive areas. An example of such a continuous interconnect is disclosed in U.S. patent application Ser. No. 11/140,460 (460 application). In the '460 application, a single, continuous interconnect attaches to multiple conductive areas of two adjacent solar cells (e.g., see '460 application, interconnect 210 shown in FIGS. 3(a) and 4). The single interconnect may have in-plane slits (e.g., see '460 application, slits 302 shown in FIGS. 3(a) and 4). The slits advantageously provide strain relief, which is particularly important in solar cell applications because solar cells may have thermal expansion coefficients that differ from encapsulation materials, such as glass. FIG. 1 shows a solar cell interconnect 100 similar to those disclosed in the '460 application.

An in-plane slit may be made larger to provide more strain relief. However, such a design would also lengthen the electrical path between adjacent solar cells, resulting in increased electrical resistance and thus efficiency loss. Providing a straight and direct electrical path between opposing tabs of an interconnect does not solve the problem because such a straight path essentially eliminates the strain relief. What is needed is an interconnect design that provides more strain relief without unduly lengthening the electrical path through the interconnect.

Figure 2:
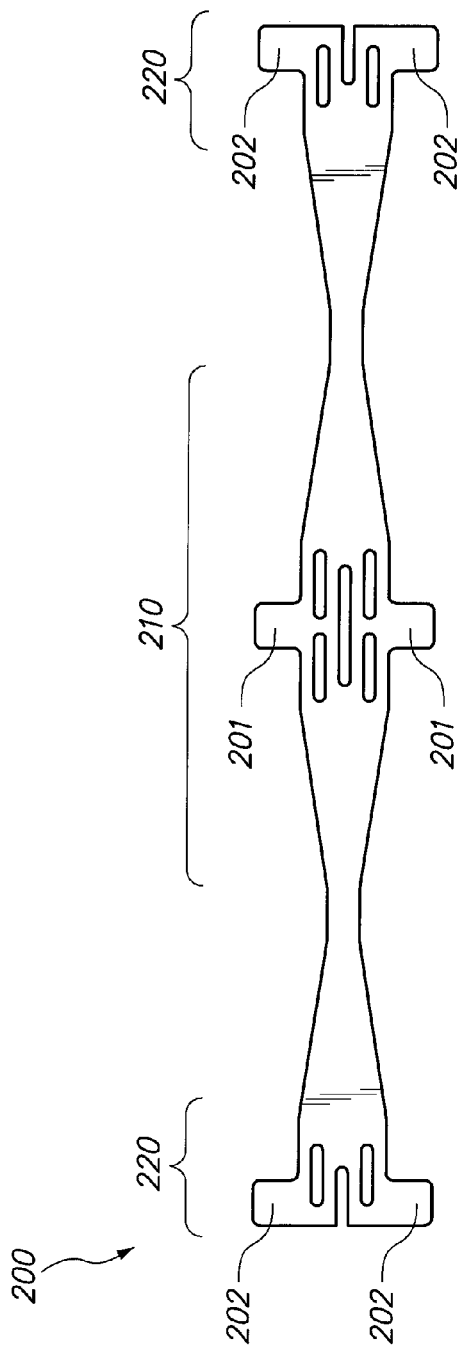
FIGS. 2, 4 and 6-10 show continuous solar cell interconnects in accordance with embodiments of the present invention.

FIG. 2 shows an interconnect 200 in accordance with an embodiment of the present invention. In the example of FIG. 2, the interconnect 200 includes a middle portion 210 and two end portions 220. Each portion of the interconnect 200 has tabs for connecting to conductive pads (also referred to as "contact points" or "conductive areas") of back side contact solar cells. The middle portion 210 has tabs 201, and the end portions 220 have tabs 202. Note that the each end portion 220 may mirror half of the middle portion 210, with appropriate adjustments in dimensions to match the dimensions of a conductive pad of a solar cell. Depending on the application, the middle and end portions may have different geometries and/or in-plane strain relief configurations to accommodate different pad designs.

Figure 4:
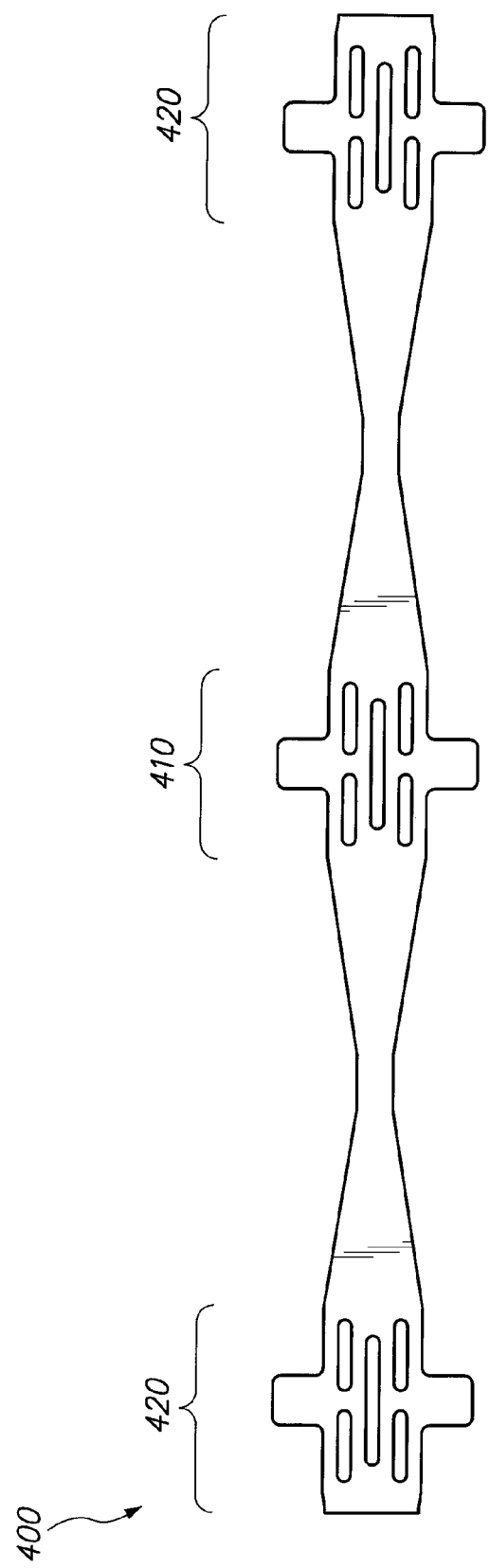

FIG. 4 shows an interconnect 400 in accordance with an embodiment of the present invention, where alternative end portions 420 are essentially the same as the middle portion 410. The interconnect 400 of FIG. 4 is an alternative embodiment with tapered (lobed) end portions 420. In the example of FIG. 4, the end portions 420 are essentially the same as the middle portion 410 but have a tapered edge. The end portions 420 have the same slit configuration as the middle portion 410.

As shown in FIG. 2, each portion of the interconnect 200 has in-plane (i.e., on the same plane as the interconnect) slits for strain relief. There are three parallel rows of slits in the middle portion 210: a single slit in the middle row, two slits in the top row, and two slits in the bottom row. In the example of FIG. 2, the slit in the middle row is made longer than those in the top and bottom rows, but does not extend past the outer ends of the slits in the top and bottom rows. The slits in the top and bottom rows add strain relief, advantageously allowing the slit in the middle row to be kept relatively short compared to conventional strain relieves. The staggered spacing of the slits allow electrical current to pass from the top tab 201 to the opposing bottom tab 201 between slits in the top and bottom rows and around the slit in the middle row. Making the slit in the middle row relatively short helps minimize electrical current path lengths between tabs; adding slits on the top and bottom rows helps increase strain relief to compensate for the relatively short slit in the middle row. As can be appreciated, this solution advantageously provides increased strain relief without unduly increasing electrical path resistance through the interconnect.

Figure 3:
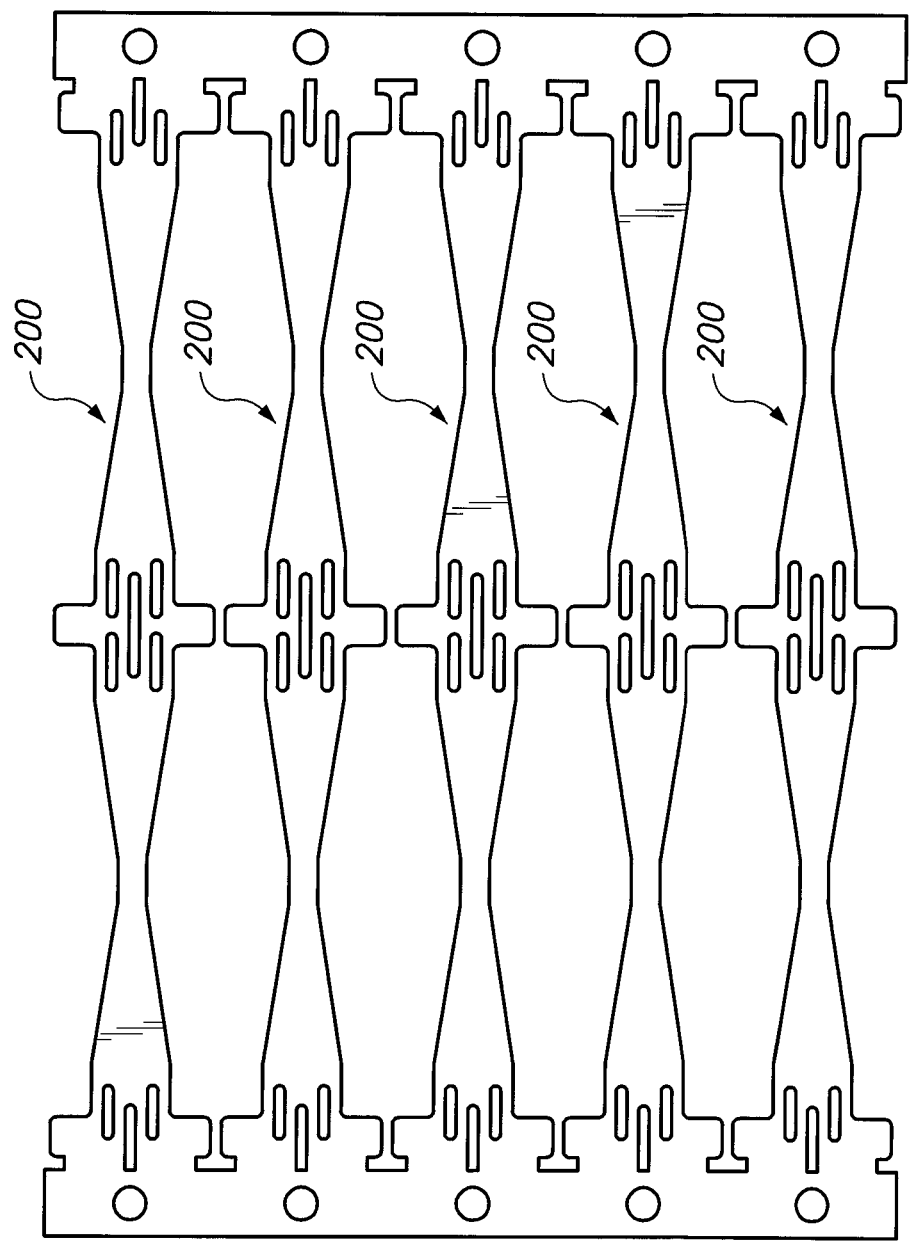
FIG. 3 shows how several solar cell interconnects may be manufactured as a stamped strip, in accordance with an embodiment of the present invention.

The design of the interconnect 200 not only provides superior strain relief compared to conventional solar cell interconnects, it also advantageously allows for low-cost manufacturing. FIG. 3 shows how several interconnects 200 may be made as a patterned strip (e.g., comprising copper) for low-cost, automated assembly. The interconnects 200 may be formed by stamping, chemical etching, EDM or other suitable manufacturing process without detracting from the merits of the present invention.

Figure 5:
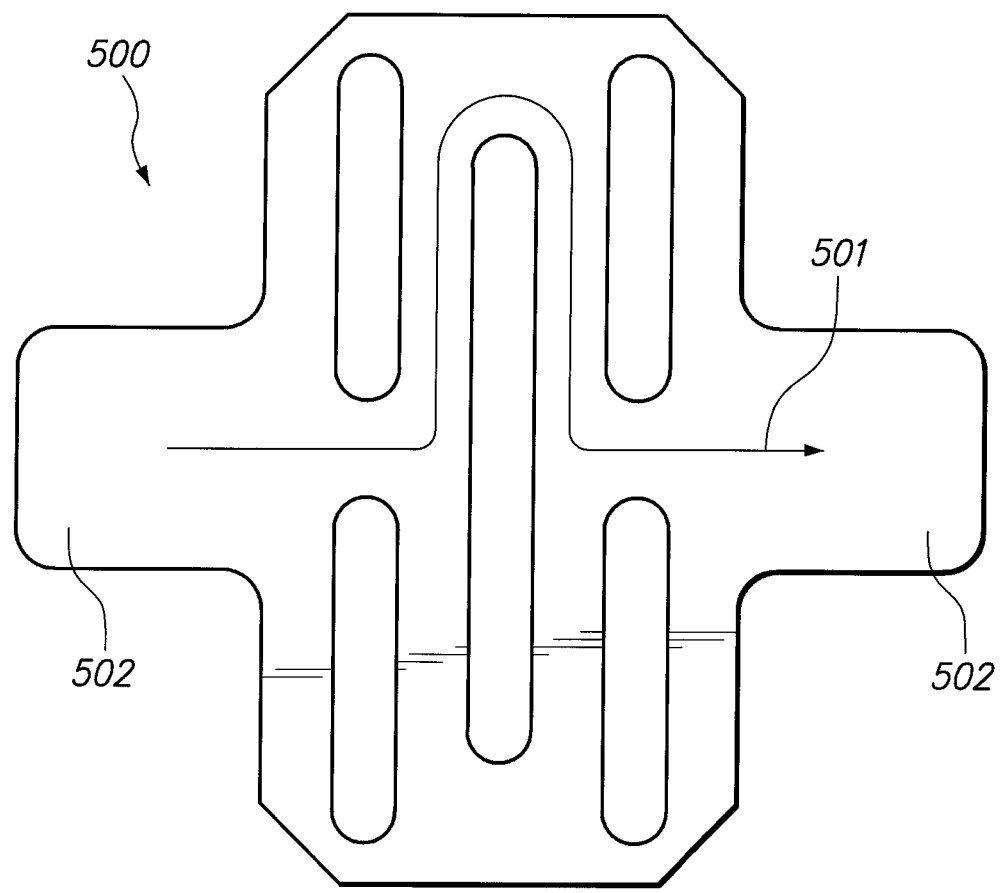
FIG. 5 shows a separate interconnect lead with strain relief features in accordance with an embodiment of the present invention.

FIG. 5 shows an alternative embodiment where a solar cell interconnect lead 500 is a separate interconnect lead (i.e., without end portions), as in the '188 application. Arrow 501 shows an example current path between opposing tabs 502. The interconnect lead 500 takes advantage of the in-plane strain relief arrangement of the continuous solar cell interconnect 200. As can be appreciated, if desired, a middle or end portion of any of the continuous solar cell interconnects disclosed herein may be employed as a separate interconnect lead. In contrast to a continuous interconnect, a separate interconnect lead only attaches to a single conductive pad on each of the adjacent solar cells. A separate interconnect lead, such as interconnect lead 500, may have a single continuous tab on each end as in FIG. 5, or two or more separate tabs on each end to meet the needs of particular applications.

FIGS. 6-10 show solar cell interconnects in alternative embodiments of the present invention. Note that the end portions of the interconnects of FIGS. 6-10 may have different slit designs than the middle portion as in the interconnect 200 of FIG. 2, or be copied versions of the middle portion as in the interconnect 400 of FIG. 4.

Figure 6:
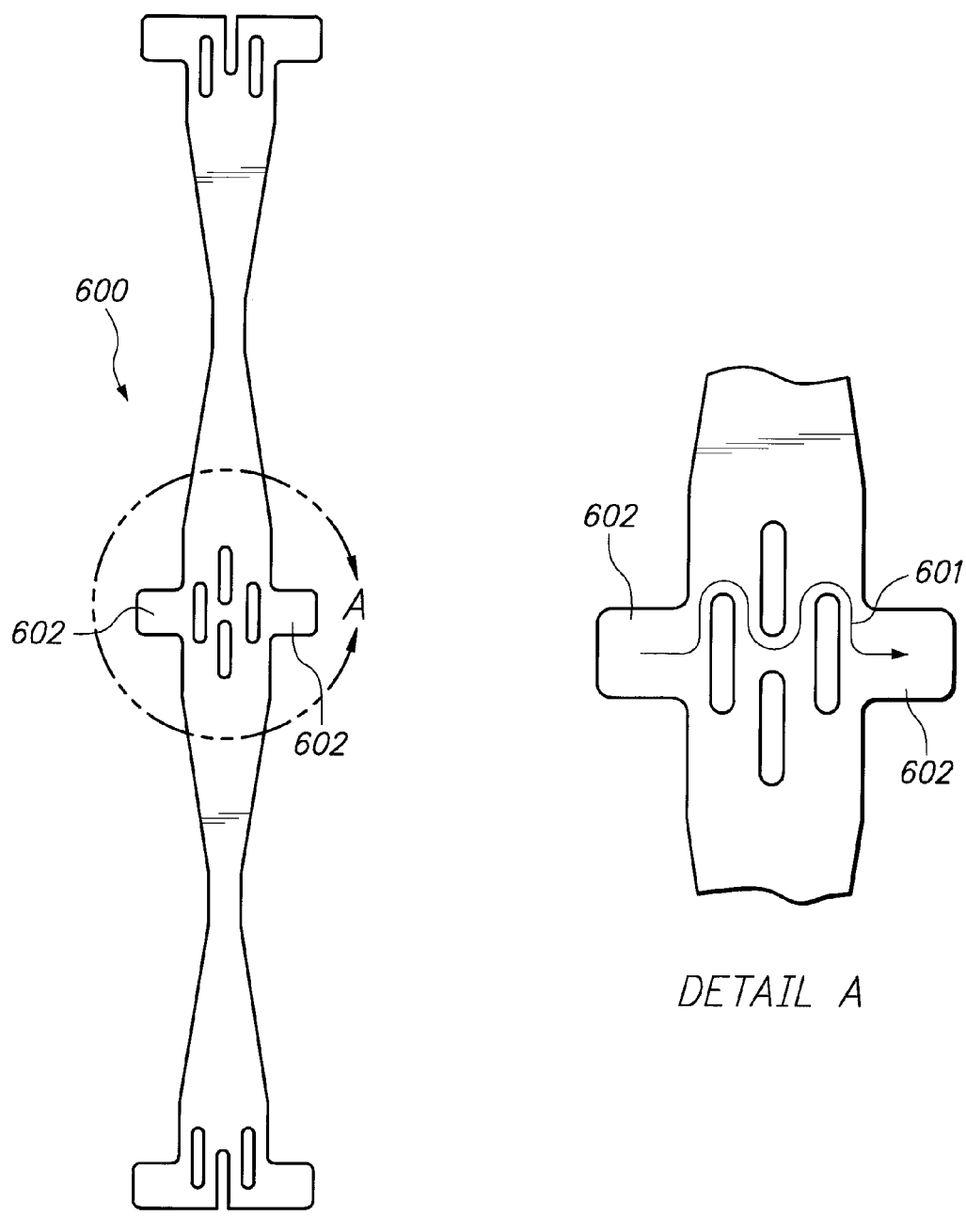

FIG. 6 shows an interconnect 600 where the middle row has two slits and the top and bottom rows each has a single slit. Detail A of FIG. 6 shows an enlarged view of the middle portion of the interconnect 600. Arrow 601 shows an example current path between opposing tabs 602.

Figure 7:
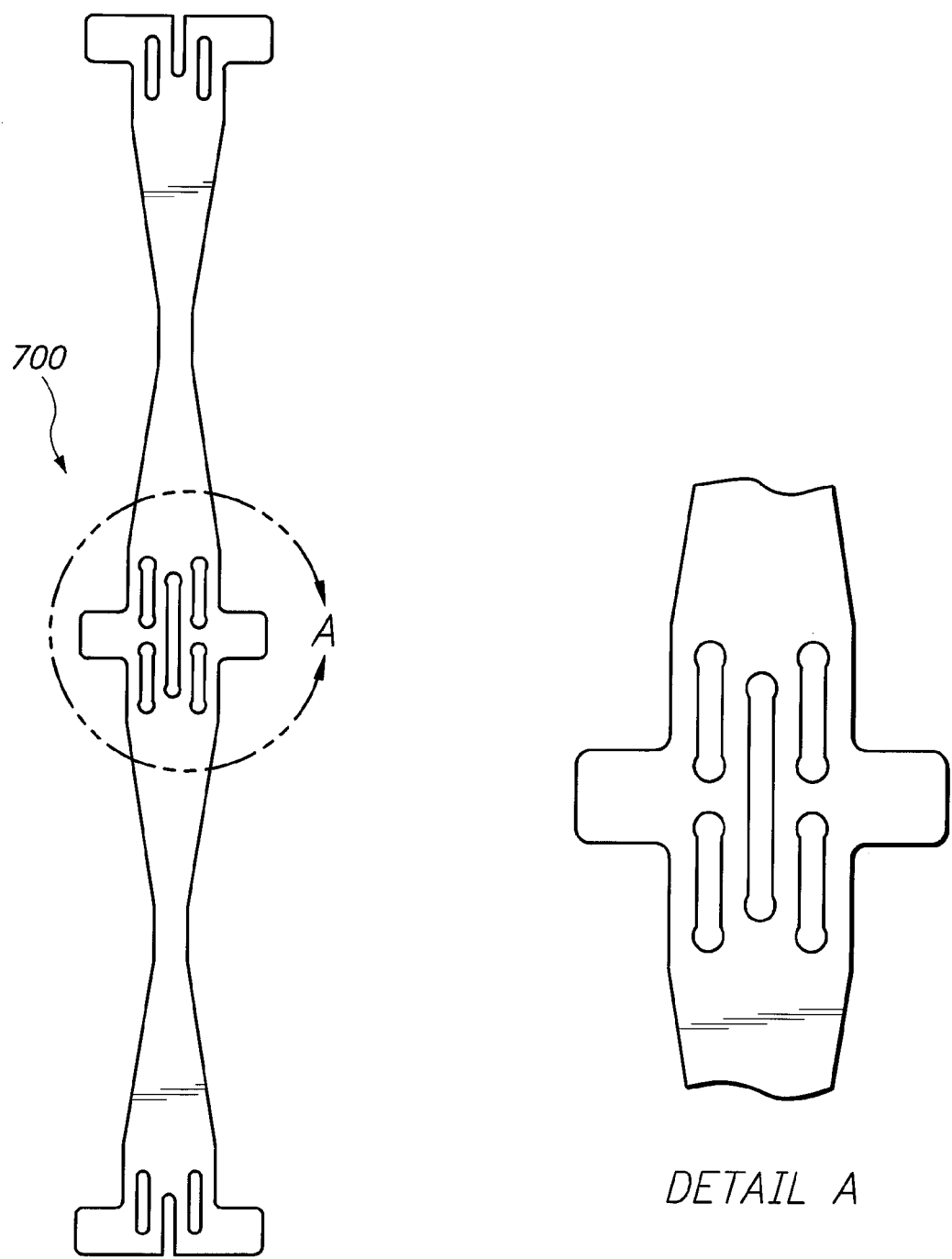

FIG. 7 shows an interconnect 700 that is similar to the interconnect 200 of FIG. 2 except for the keyholes at the ends of the slits. Detail A of FIG. 7 shows an enlarged view of the middle portion of the interconnect 700.

Figure 8:
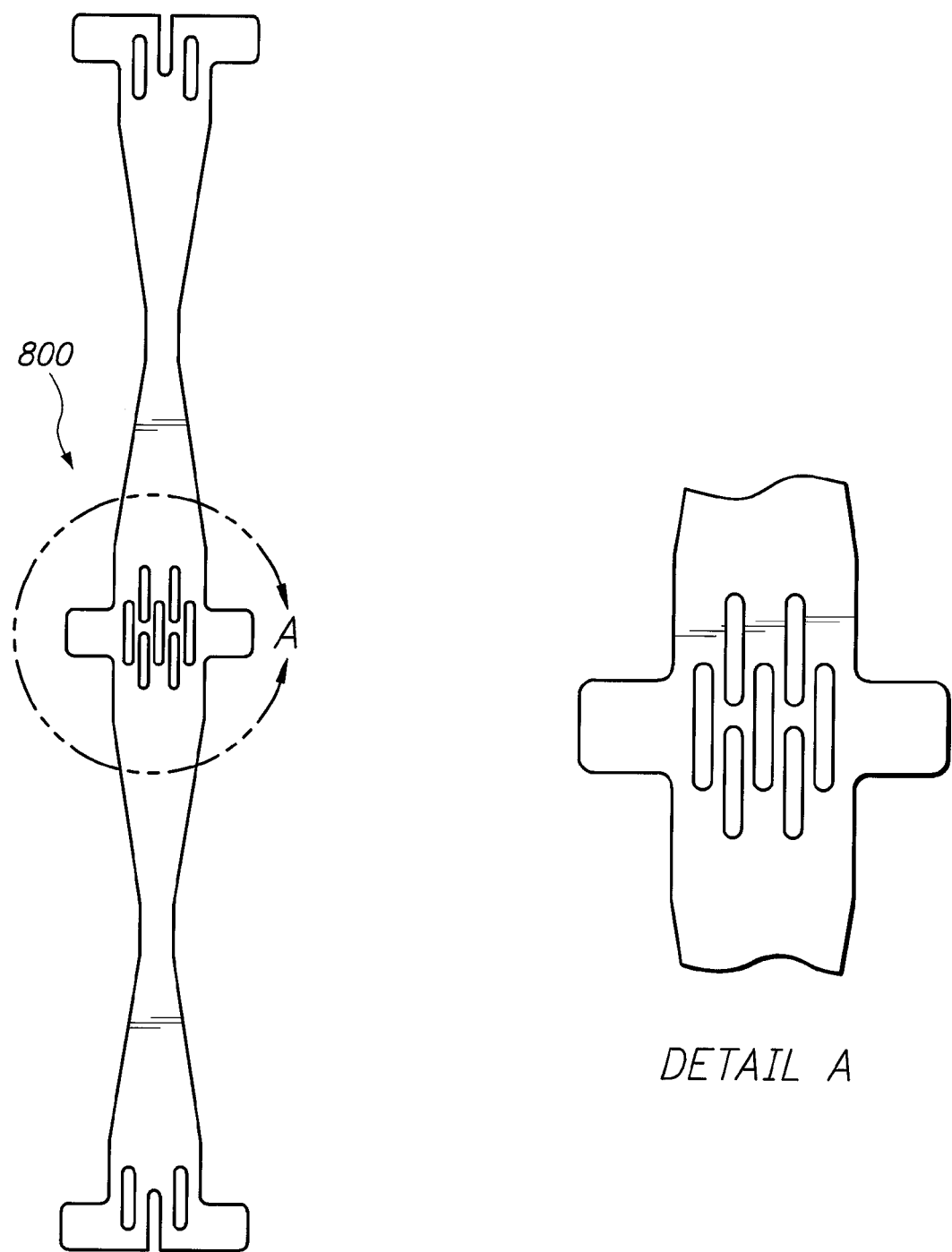

FIG. 8 shows an interconnect 800 with more than three rows of slits. Detail A of FIG. 8 shows an enlarged view of the middle portion of the interconnect 800.

Figure 9:
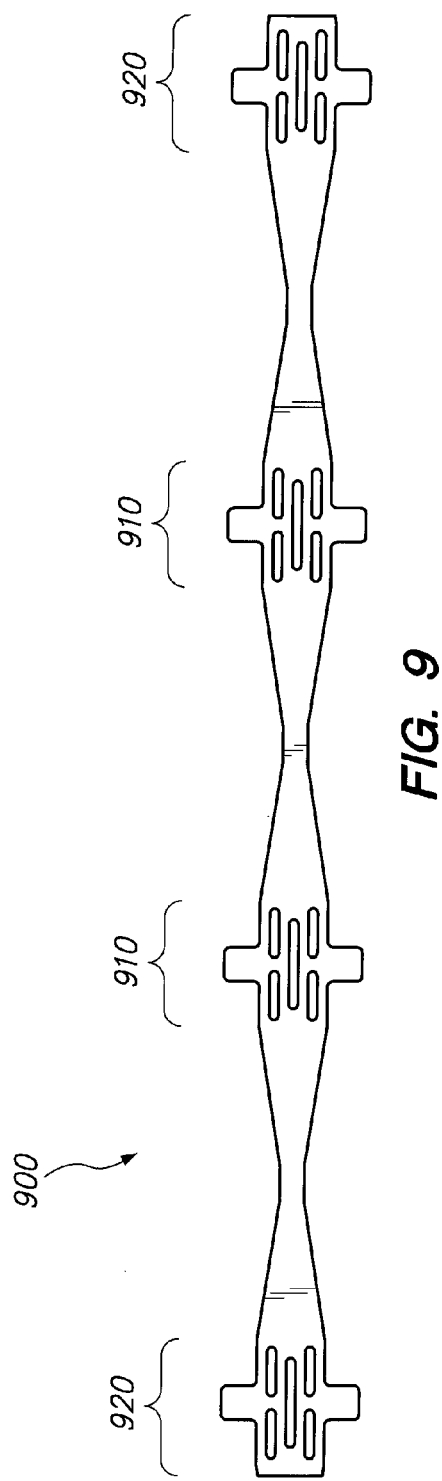

FIG. 9 shows an interconnect 900 with more than three portions. In the example of FIG. 9, there are two middle portions 910 and two end portions 920.

Figure 10:
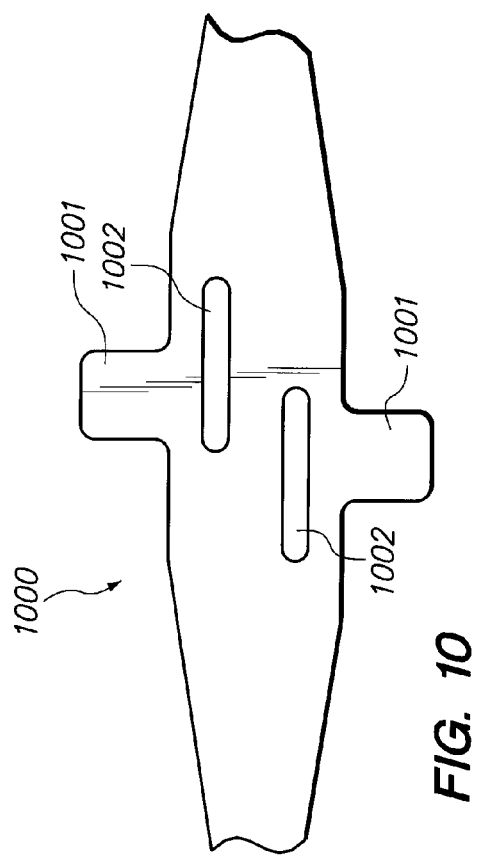

FIG. 10 shows an interconnect 1000 with offset tabs 1001 and two rows of offset slits 1002.

Figure 11:
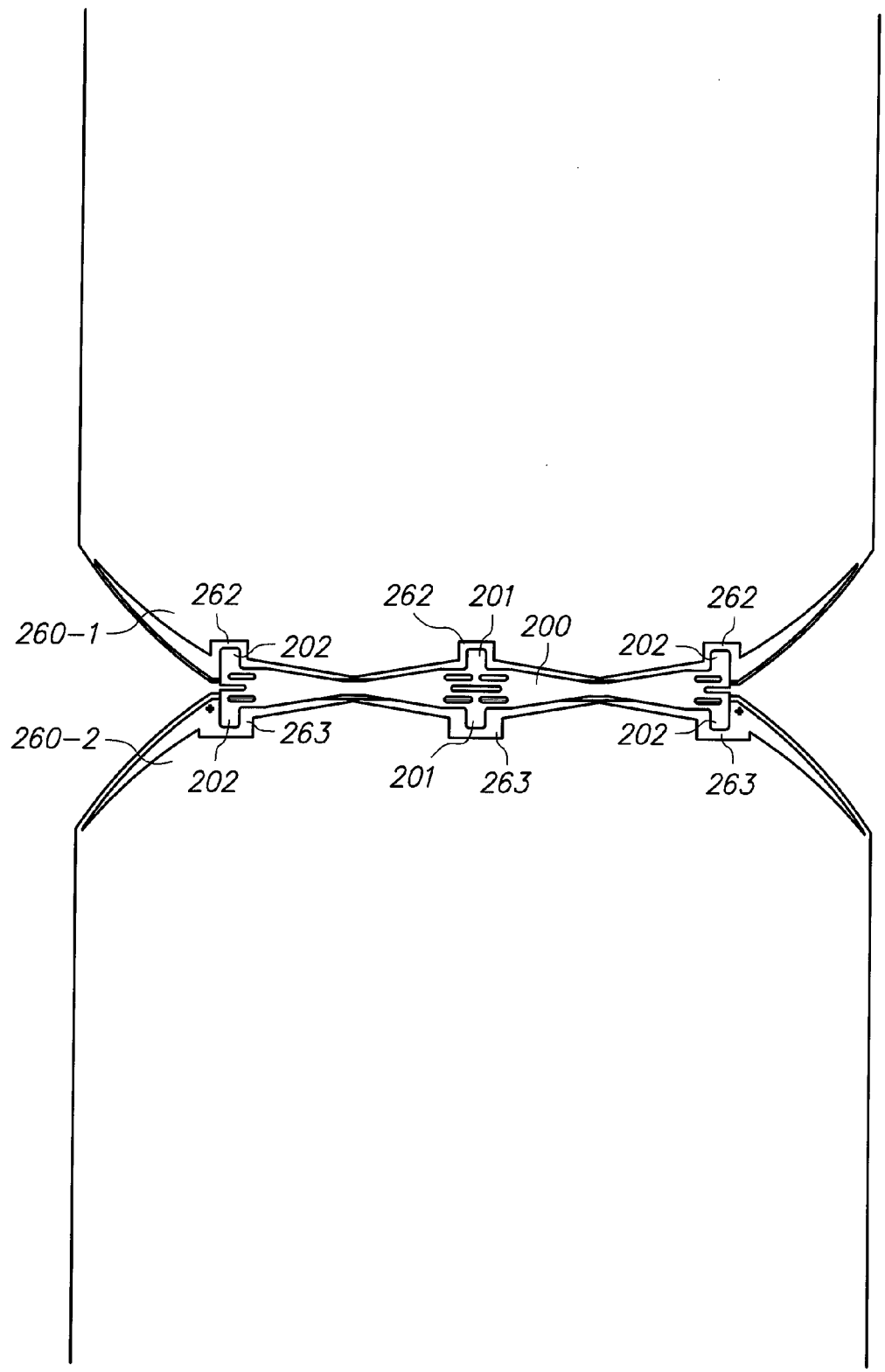
FIG. 11 shows a continuous interconnect electrically connecting adjacent back side contact solar cells, in accordance with an embodiment of the present invention.

FIG. 11 shows the continuous interconnect 200 electrically connecting adjacent back side contact solar cells 260-1 and 260-2. In the example of FIG. 11, tabs 202 and 201 of the interconnect 200 electrically connect positive pads 263 of the solar cell 260-2 to the negative pads 262 of the solar cell 260-1, on the back sides of the solar cells. As is well understood, the front side of a solar cell faces the sun to collect solar radiation during normal operation; the back side is opposite the front side.

Figure 12:
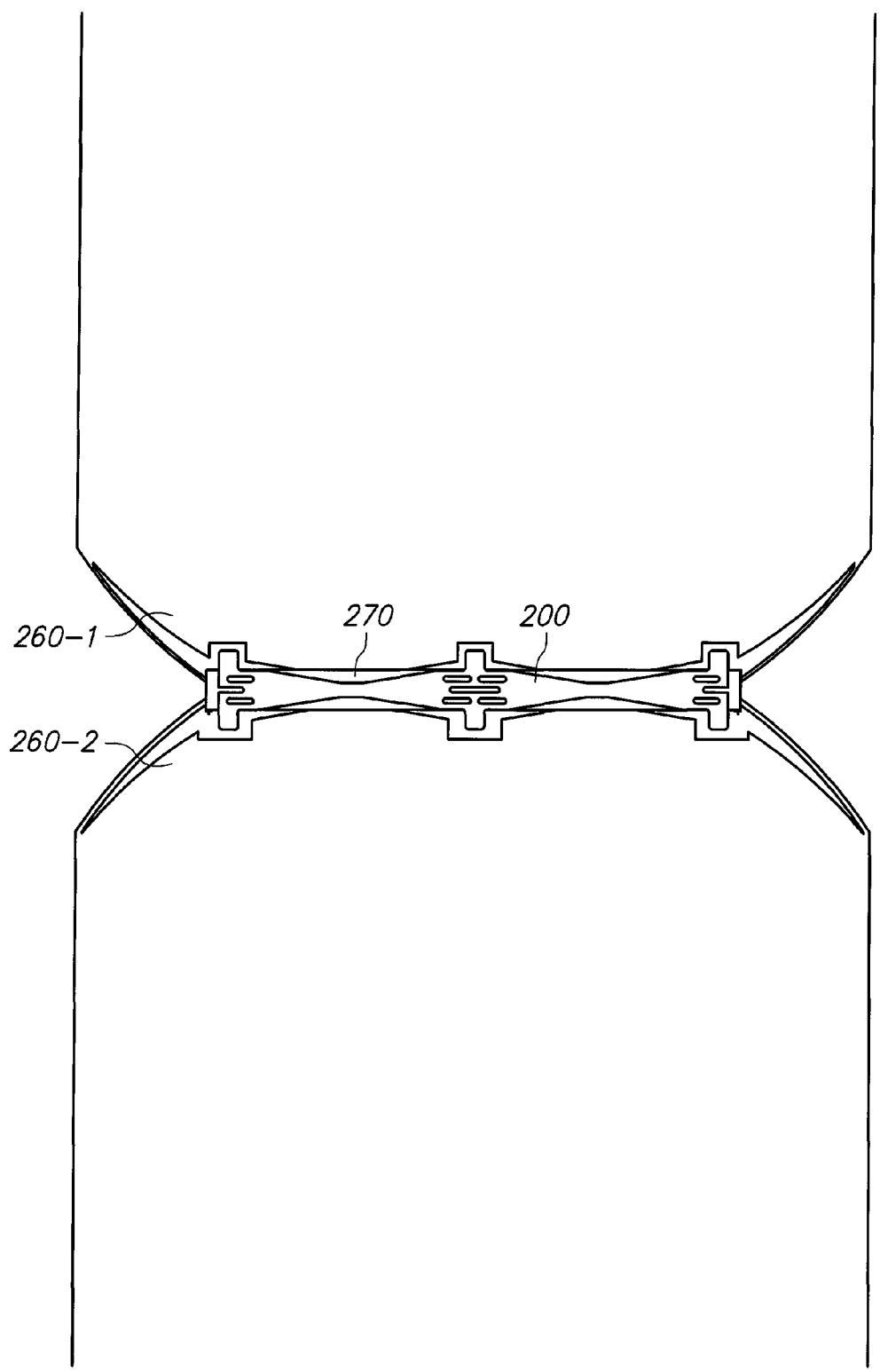
FIG. 12 shows the interconnect arrangement of FIG. 11 with an interconnect shield, in accordance with an embodiment of the present invention.

FIG. 12 shows the continuous interconnect 200 employed with an interconnect shield 270, as in the '460 application. Also shown in FIG. 12 are the back side contact solar cells 260-1 and 260-2 electrically connected by the continuous interconnect 200 as in FIG. 11. The interconnect shield 270 may be located between the interconnect 200 and the solar cells 260-1 and 260-2. The interconnect shield 270 may comprise a material that provides electrical insulation and can visually block the interconnect 200 as seen from the front side of the solar cells 260-1 and 260-2. Alternatively, instead of using a separate interconnect shield 270, the interconnect 200 may be printed or chemically treated to have a color that does not detract from the aesthetics of the solar cells 260-1 and 260-2 at least as viewed from the front side.

Solar cell interconnects with multiple current paths have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A solar cell interconnect comprising:
   a first portion having two in-plane slits on a first row of the first portion, a single in-plane slit on a second row of the first portion, and two in-plane slits on a third row of the first portion, the single in-plane slit on the second row of the first portion being longer than each of the two in-plane slits on the first row and the third row but does not extend past outer ends of the two in-plane slits on the first row and on the third row of the first portion; and a second portion having a first row, a second row, and a third row, the second portion having at least one in-plane slit on the first row of the second portion and at least one in-plane slit on the third row of the second portion;

wherein the solar cell interconnect has a continuous solid plane between the first and second portions.

2. The solar cell interconnect of claim 1 wherein the second portion has a single enclosed in-plane slit on the first row of the second portion, a single enclosed in-plane slit on the third row of the second portion, and a single enclosed in-plane slit on the second row of the second portion that mirrors half of the single enclosed in-plane slit on the second row of the first portion.

3. The solar cell interconnect of claim 1 wherein the second portion comprises two enclosed in-plane slits on the first row of the second portion, a single enclosed in-plane slit on the second row of the second portion, and two enclosed in-plane slits on the third row of the second portion, the single enclosed in-plane slit on the second row of the second portion being longer than but does not extend past outer ends of the two enclosed in-plane slits on the first row and on the third row of the second portion.

4. The solar cell interconnect of claim 1 wherein the solar cell interconnect comprises copper.

5. A solar cell interconnect comprising:
a first portion having a plurality of enclosed in-plane slits on a top row, a plurality of in-plane slits on a bottom row, and an enclosed in-plane slit on a middle row between the top and bottom rows, the enclosed in-plane slit on the middle row being longer than each of the plurality of enclosed in-plane slits on the top and bottom rows, the enclosed in-plane slit on the middle row being staggered relative to two enclosed in-plane slits on the top row and two enclosed in-plane slits on the bottom row; and a second portion having at least one enclosed in-plane slit on a first row; wherein the solar cell interconnect has a continuous solid plane between the first and second portions.

6. The solar cell interconnect of claim 5 wherein the second portion has a single enclosed in-plane slit on the first row of the second portion, a single enclosed in-plane slit on a third row of the second portion, and a single enclosed in-plane slit on a second row of the second portion that mirrors half of the enclosed in-plane slit on the middle row of the first portion.

7. The solar cell interconnect of claim 5 wherein the second portion comprises two enclosed in-plane slits on the first row of the second portion, a single enclosed in-plane slit on a second row of the second portion, and two enclosed in-plane slits on a third row of the second portion.

8. The solar cell interconnect of claim 5 wherein each enclosed in-plane slit in the plurality of enclosed in-plane slits on the top row and in the plurality of enclosed in-plane slits on the bottom row has a keyhole pattern on both ends of the enclosed in-plane slit.

9. The solar cell interconnect of claim 8 wherein the enclosed in-plane slit on the middle row has a keyhole pattern on both ends.

10. The solar cell interconnect of claim 5 further comprising an enclosed in-plane slit on another row below the bottom row of the first portion.

11. The solar cell interconnect of claim 10 wherein the enclosed in-plane slit on the other row below the bottom row of the first portion is longer than each of the plurality of enclosed in-plane slits on the bottom row.

12. The solar cell interconnect of claim 5 further comprising a third portion having at least one enclosed in-plane slit on a first row, wherein the solar cell interconnect has a solid plane between the second and third portions.

13. The solar cell interconnect of claim 5 wherein the solar cell interconnect comprises copper.

14. A solar cell array comprising:
a solar cell interconnect comprising a first portion having a plurality of elongated enclosed openings on a top row, a plurality of elongated enclosed openings on a bottom row, and an elongated enclosed opening on a middle row between the top and bottom rows, the elongated enclosed opening on the middle row being longer than each of the plurality of elongated enclosed openings on the top and bottom rows, the elongated enclosed opening on the middle row being staggered relative to two elongated enclosed openings on the top row and two elongated enclosed openings on the bottom row;

a first solar cell having a conductive pad, the first portion of the solar cell interconnect further comprising a first tab electrically connected to the conductive pad of the first solar cell; and a second solar cell having a conductive pad, the first portion of the solar cell interconnect further comprising a second tab electrically connected to the conductive pad of the second solar cell, wherein the solar cell interconnect further comprises a second portion having a first tab electrically connected to another conductive pad of the first solar cell and a second tab electrically connected to another conductive pad of the second solar cell, the solar cell interconnect having a continuous solid plane between the first and second portions.

15. The solar cell array of claim 14 wherein the conductive pad of the first solar cell is on a backside of the first solar cell and the conductive pad of the second solar cell is on a backside of the second solar cell.

16. The solar cell array of claim 14 wherein the other conductive pad of the first solar cell is on a backside of the first solar cell and the other conductive pad of the second solar cell is on a backside of the second solar cell.

17. The solar cell array of claim 14 further comprising:
an interconnect shield located between the solar cell interconnect and the first and second solar cells, the interconnect shield comprising a material that provides electrical insulation.

18. The solar cell array of claim 17 wherein the interconnect shield visually blocks the solar cell interconnect as seen from a front side of the first and second solar cells.

19. The solar cell array of claim 14 wherein the solar cell interconnect comprises copper.

* * * * *